(12) United States Patent
Lin et al.

(10) Patent No.: US 10,635,398 B2
(45) Date of Patent: *Apr. 28, 2020

(54) VOLTAGE SENSING TYPE OF MATRIX MULTIPLICATION METHOD FOR NEUROMORPHIC COMPUTING SYSTEM

(71) Applicant: MACRONIX INTERNATIONAL CO., LTD., Hsinchu (TW)

(72) Inventors: Yu-Yu Lin, Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 33 days.

This patent is subject to a terminal disclaimer.

(21) Appl. No.: 15/922,359

(22) Filed: Mar. 15, 2018

(65) Prior Publication Data

US 2019/0286419 A1  Sep. 19, 2019

(51) Int. Cl.
  *G06F 7/544* (2006.01)
  *G06F 17/16* (2006.01)
  (Continued)

(52) U.S. Cl.
  CPC .......... *G06F 7/5443* (2013.01); *G06F 17/16* (2013.01); *G11C 13/004* (2013.01);
  (Continued)

(58) Field of Classification Search
  CPC .............................. G06F 7/5443; G06F 17/16
  See application file for complete search history.

(56) References Cited

U.S. PATENT DOCUMENTS 4,219,829 A  8/1980 Dorda et al.
4,987,090 A  1/1991 Hsu et al.
(Continued)

FOREIGN PATENT DOCUMENTS

CN  1998012 B  11/2010
TW  201618284 A  5/2016
(Continued)

OTHER PUBLICATIONS

Schuller et al., "Neuromorphic Computing: From Materials to Systems Architecture," US Dept. of Energy, Oct. 29-30, 2015, Gaithersburg, MD, 40 pages.
(Continued)

*Primary Examiner* — Chuong D Ngo
(74) *Attorney, Agent, or Firm* — Haynes Beffel & Wolfeld LLP

(57) ABSTRACT

A device for generating sum-of-products data includes an array of variable resistance cells, variable resistance cells in the array each including a transistor and a programmable resistor connected in parallel, the array including n columns of cells including strings of series-connected cells and m rows of cells. Control and bias circuitry are coupled to the array, including logic for programming the programmable resistors in the array with resistances corresponding to values of a weight factor $W_{mn}$ for the corresponding cell. Alternatively, the resistances can be programmed during manufacture. Input drivers are coupled to corresponding ones of the m rows of cells, the input drivers selectively applying inputs $X_m$ to rows m. Column drivers are configured to apply currents $I_n$ to corresponding ones of the n columns of cells. Voltage sensing circuits operatively coupled to the columns of cells.

14 Claims, 14 Drawing Sheets

(51) Int. Cl.
   *G11C 13/00* (2006.01)
   *G11C 14/00* (2006.01)

(52) U.S. Cl.
   CPC ...... *G11C 13/0004* (2013.01); *G11C 13/0007* (2013.01); *G11C 13/0026* (2013.01); *G11C 13/0028* (2013.01); *G11C 13/0069* (2013.01); *G06F 2207/4802* (2013.01); *G11C 14/009* (2013.01); *G11C 2213/31* (2013.01); *G11C 2213/32* (2013.01); *G11C 2213/34* (2013.01)

(56) References Cited

U.S. PATENT DOCUMENTS

| | | | |
|---|---|---|---|
| 5,586,073 | A | 12/1996 | Hiura et al. |
| 6,107,882 | A | 8/2000 | Gabara et al. |
| 6,313,486 | B1 | 11/2001 | Kencke et al. |
| 6,829,598 | B2 | 12/2004 | Milev |
| 6,906,940 | B1 | 6/2005 | Lue |
| 6,960,499 | B2 | 11/2005 | Nandakumar et al. |
| 7,368,358 | B2 | 5/2008 | Ouyang et al. |
| 7,747,668 | B2 | 6/2010 | Nomura et al. |
| 8,203,187 | B2 | 6/2012 | Lung et al. |
| 8,275,728 | B2 | 9/2012 | Pino |
| 8,432,719 | B2 | 4/2013 | Lue |
| 8,589,320 | B2 | 11/2013 | Breitwisch et al. |
| 8,630,114 | B2 | 1/2014 | Lue |
| 8,860,124 | B2 | 10/2014 | Lue et al. |
| 9,064,903 | B2 | 6/2015 | Mitchell et al. |
| 9,431,099 | B2 | 8/2016 | Lee et al. |
| 9,524,980 | B2 | 12/2016 | Lue |
| 9,536,969 | B2 | 1/2017 | Yang et al. |
| 9,589,982 | B1 | 3/2017 | Cheng et al. |
| 9,698,156 | B2 | 7/2017 | Lue |
| 9,698,185 | B2 | 7/2017 | Chen et al. |
| 9,710,747 | B2 | 7/2017 | Kang et al. |
| 2003/0122181 | A1 | 7/2003 | Wu |
| 2005/0287793 | A1 | 12/2005 | Blanchet et al. |
| 2010/0182828 | A1 | 7/2010 | Shima et al. |
| 2010/0202208 | A1 | 8/2010 | Endo et al. |
| 2011/0063915 | A1 | 3/2011 | Tanaka et al. |
| 2011/0106742 | A1 | 5/2011 | Pino |
| 2011/0286258 | A1 | 11/2011 | Chen et al. |
| 2012/0044742 | A1 | 2/2012 | Narayanan |
| 2012/0235111 | A1 | 9/2012 | Osano et al. |
| 2013/0075684 | A1 | 3/2013 | Kinoshita et al. |
| 2014/0119127 | A1 | 5/2014 | Lung et al. |
| 2014/0268996 | A1 | 9/2014 | Park |
| 2015/0008500 | A1 | 1/2015 | Fukumoto et al. |
| 2016/0181315 | A1 | 6/2016 | Lee et al. |
| 2016/0308114 | A1 | 10/2016 | Kim et al. |
| 2016/0336064 | A1 | 11/2016 | Seo et al. |
| 2017/0092370 | A1 | 3/2017 | Harari |
| 2017/0148517 | A1 | 5/2017 | Harari |
| 2017/0169887 | A1 | 6/2017 | Widjaja |
| 2017/0270405 | A1 | 9/2017 | Kurokawa |
| 2019/0148393 | A1 | 5/2019 | Lue |
| 2019/0220249 | A1 | 7/2019 | Lee et al. |
| 2019/0244662 | A1 | 8/2019 | Lee et al. |

FOREIGN PATENT DOCUMENTS

| | | |
|---|---|---|
| TW | 201802800 A | 1/2018 |
| WO | 2012015450 A1 | 2/2012 |
| WO | 2017091338 A1 | 6/2017 |

OTHER PUBLICATIONS

U.S. Appl. No. 15/873,369, filed Jan. 17, 2018, entitled "Sum-Of-Products Accelerator Array," Lee et al., 52 pages.
U.S. Appl. No. 15/887,166, filed Feb. 2, 2018, entitled "Sum-Of-Products Array for Neuromorphic Computing System," Lee et al., 49 pages.
U.S. Appl. No. 15/895,369, filed Feb. 13, 2018, entitled "Device Structure for Neuromorphic Computing System," Lin et al., 34 pages.
EP Extended Search Report from 18155279.5-1203 dated Aug 30, 2018, 8 pages.
EP Extended Search Report from EP18158099.4 dated Sep. 19, 2018, 8 pages.
Soudry, et al. "Hebbian learning rules with memristors," Center for Communication and Information Technologies CCIT Report #840, Sep. 1, 2013, 16 pages.
U.S. Office Action in U.S. Appl. No. 15/887,166 dated Jan. 30, 2019, 18 pages.
Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.
Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.
Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent).
Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.
Sakai et al., "A Buried Giga-Ohm Resistor (BGR) Load Static RAM Cell," IEEE Symp. on VLSI Technology, Digest of Papers, Sep. 10-12, 1984, 2 pages.
Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.
Tanaka H., et al., "Bit Cost Scalable Technology with Punch and Plug Process for Ultra High Density Flash Memory," 2007 Symp. VLSI Tech., Digest of Tech. Papers, pp. 14-15.
U.S. Office Action in related case U.S. Appl. No. 15/873,369 dated May 9, 2019, 8 pages.
Whang, SungJin et al. "Novel 3-dimensional Dual Control-gate with Surrounding Floating-gate (DC-SF) NAND flash cell for 1Tb tile storage application," 2010 IEEE Int'l Electron Devices Meeting (IEDM), Dec. 6-8, 2010, 4 pages.
Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.
U.S. Office Action in U.S. Appl. No. 16/233,404 dated Oct. 31, 2019, 22 pages.

VOLTAGE SENSING TYPE OF MATRIX MULTIPLICATION METHOD FOR NEUROMORPHIC COMPUTING SYSTEM

BACKGROUND

Field

The present invention relates to circuitry that can be used to perform or support sum-of-products operations.

Description of Related Art

In neuromorphic computing systems, machine learning systems and circuitry used for some types of computation based on linear algebra, the sum-of-products function can be an important component. The function can be expressed as follows:

$$f(x_i) = \sum_{i=1}^{M} W_i x_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function.

For high-speed implementations, it is desirable to have a very large array so that many operations can be executed in parallel, or very large sum-of-products series can be performed. In the systems, there can be a very large number of inputs and outputs, so that the total current consumption can be very large.

It is desirable to provide structures for sum-of-products functions suitable for implementation in large arrays, and that can be more energy-efficient.

SUMMARY

A device is described that comprises an array of variable resistance cells, where a variable resistance cell in the array comprises a transistor and a programmable resistor connected in parallel. The device can be operated so that an input voltage applied to the transistor and the resistance of the programmable resistor can represent input and weight variables of sum-of-products operations. The variable resistance of each variable resistance cell, in embodiments described herein, is a function of a voltage applied to the gate of the transistor in the cell, a threshold of the transistor, and the resistance of the programmable resistor. In some embodiments, the programmable resistors are one-time programmable, or programmed with variant resistances during manufacture of the device, so that the resistances of the variable resistance cells vary across the array. In some embodiments, the programmable resistors are programmable many times, so that they can be programmed with variant resistances in system, during set up or during operations of the device.

The device in some embodiments includes a voltage sensing sense amplifier, configured to sense the voltage generated by the variable resistance cells, as a function of an applied current and the resistance of the variable resistance cells. In this manner, the magnitude of the current generated to produce the sum-of-products result can be limited or fixed, reducing the power consumption.

The array can be implemented using cells consisting of one transistor and one resistor (1T-1R). Furthermore, embodiments described herein can implement the resistor as a buried implant resistor within the layout footprint of a single variable threshold transistor, in effect making an array of one transistor (1T) cells, for a very compact layout configured for sum-of-products operations with voltage sensing.

Embodiments are described in which variable resistance cells in the array are configured in a plurality of strings of series-connected variable resistance cells. A plurality of word lines can be coupled to the strings of series-connected variable resistance cells. Word line drivers are connected to the plurality of word lines to apply variable gate voltages to the transistors in the variable resistance cells.

A device for generating sum-of-products is described that comprises an array of variable resistance cells, and in which the variable resistance cells each comprise a transistor and a programmable resistor connected in parallel. The array can include n columns of cells including strings of series-connected cells and m rows of cells. The device in this example includes m input drivers coupled to corresponding ones of the m rows of cells; the input drivers selectively applying inputs $X_m$ to rows m. The device in this example can also include n column drivers applying currents $I_n$ to corresponding ones of the n columns of cells. The device includes voltage sensing circuits operatively coupled to the n columns of cells.

According to technology described herein, the programmable resistor in the variable resistance cell can be implemented using a buried implant resistor in the transistor, programmed by an implant doping profile including one or more of implant concentration and implant diffusion region geometry.

According to technology described herein, control and bias circuitry coupled to the array, including logic for programming the programmable resistors in the array with resistances corresponding to values of a weight factor $W_{mn}$ for the corresponding cell at row m and column n. Examples of programmable resistors usable in the variable resistance cells which can be programmed using logic on the device include phase change resistive memory elements, metal oxide resistive memory elements, and conductive bridge resistive memory elements. In another example, the programmable resistors in the variable resistance cells comprise a memory cell such as an SRAM, and a resistor in parallel with a second transistor having a gate connected to the memory cell.

A device for generating sum-of-products data is provided that includes an array of variable resistance cells, variable resistance cells in the array each comprising a transistor and a programmable resistor connected in parallel, the array including n columns of cells including strings of series-connected cells and m rows of cells. Control and bias circuitry are coupled to the array, including logic for programming the programmable resistors in the array with thresholds corresponding to values of a weight factor $W_{mn}$ for the corresponding cell. Input drivers are coupled to corresponding ones of the m rows of cells, the input drivers selectively applying inputs $X_m$ to rows m. Column drivers are configured to apply currents $I_n$ to corresponding ones of the n columns of cells. Voltage sensing circuits are operatively coupled to the columns of cells.

A system including a memory array and a sum-of-products accelerator array interconnected using a data path controller is described. The sum-of-products accelerator array comprises an array of variable resistance cells. The memory array can be used in coordination with the sum-of-products accelerator array for configuration and operation of the sum-of-products functions.

A method for operating an array of variable resistance cells to produce sum-of-products data comprises programming the programmable resistors in the array with resistances corresponding to values of weight factors for the corresponding cells; selectively applying inputs to rows of cells in the array; applying currents to corresponding ones of the columns of cells in the array; and sensing voltages on one or more of the columns of cells in the array.

Other aspects and advantages of the present invention can be seen on review of the drawings, the detailed description and the claims, which follow.

DETAILED DESCRIPTION

A detailed description of embodiments of the present invention is provided with reference to the FIGS. 1-20.

Figure 1:
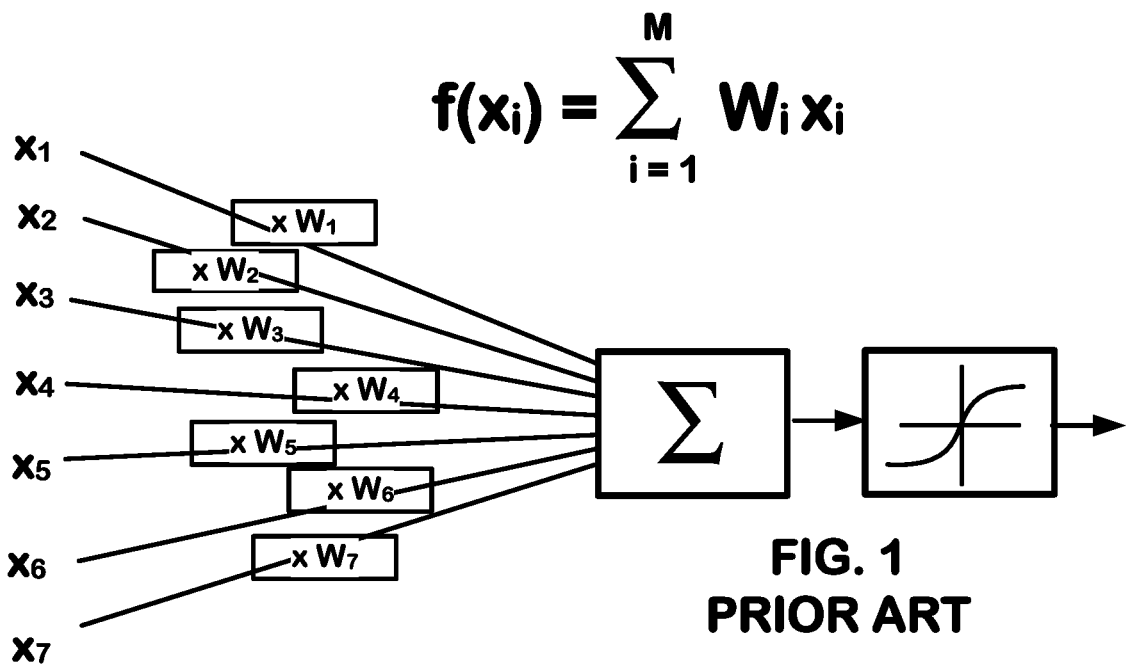
FIG. 1 is a functional diagram of a sum-of-products operation which can be a fundamental element of a neuromorphic computing system known in the prior art.

FIG. 1 is a diagram of a sum-of-products operation, where the terms of the summation are the product of input $X_i$ times a weight $W_1$, in this example, where i goes from 1 to 7. The weight $W_i$ can differ over the terms of the summation. In operation, the weights can be assigned as a set of coefficients, and then the inputs applied to compute a summation that changes as the inputs change. Also, in algorithms executing a learning procedure, the weights can be changed from time to time as the learning procedures change coefficients to learn from the summation that achieves a useable result.

In the illustrated example, the output of the summation is applied to a sigmoid function to produce an output that ranges in a non-linear fashion between a minimum and a maximum such as between 0 and 1. This is a common model of a synapse for example used in neuromorphic computing. Other activation functions can be used as well, such as a logit function. The sum-of-products operation can be applied as well in configurations not neuromorphic or not otherwise considered to model neurological systems.

Figure 2:
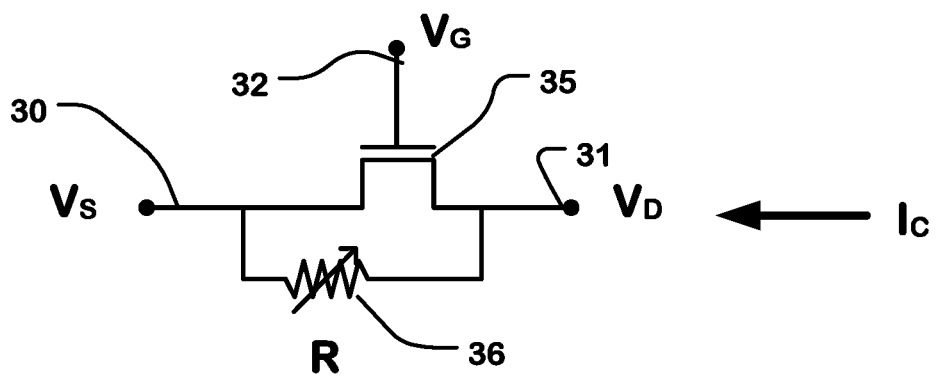
FIG. 2 is a schematic diagram of a variable resistance cell according to embodiments described herein.
Figure 3:
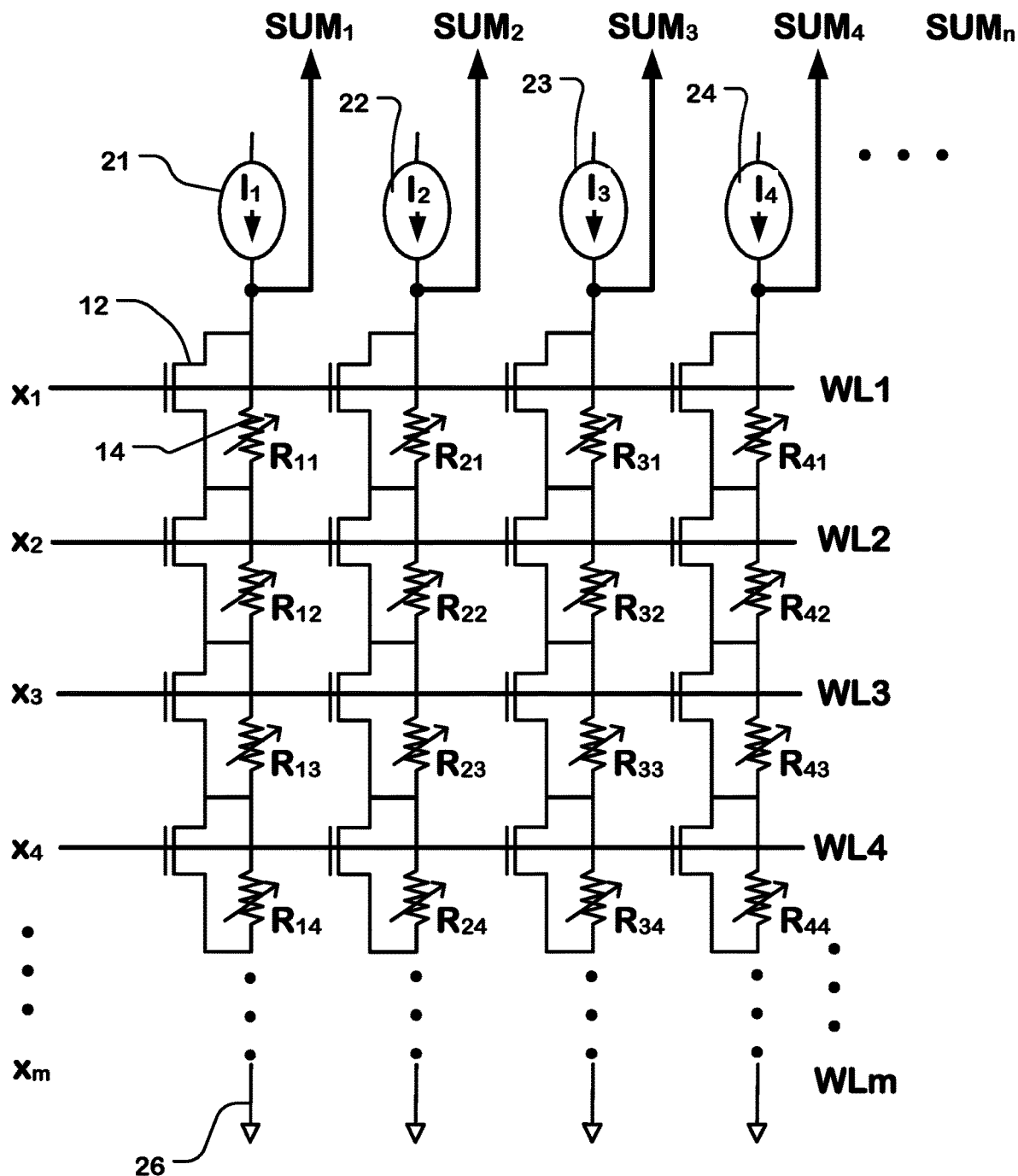
FIG. 3 illustrates a portion of an array of variable resistance cells configured for sum-of-products operations.

FIG. 2 is a schematic diagram of one variable resistance cell, such as that used in the array of FIG. 3. The variable resistance cell includes a first current-carrying node 30, a second current-carrying node 31 and a control terminal 32. A transistor 35 and a programmable resistor 36 are connected in parallel to the first and second current-carrying nodes. The transistor has a gate connected to the control terminal 32.

A voltage $V_G$ on the control terminal 32 can be characterized as a gate voltage for the transistor 35. The control terminal 32 can correspond to a word line in the array shown in FIG. 3. A voltage $V_S$ on the first current-carrying node 30 can be characterized as a source voltage for the cell. A voltage $V_D$ on the second current-carrying node 31 can be characterized as a drain voltage for the cell.

In this example, a cell current $I_C$ is applied to the second current-carrying node 31, having a current amplitude that is set in design, or adjustable, to establish a voltage drop in the cell, depending on the voltage range of the voltage sense amplifier, and the resistance values in the cells for the resistor 36. The current amplitude can be tuned according to a particular embodiment of the array, so that a usable range of voltages can be generated on the string for supply to the summing node. Also, the range of programmable resistances of the resistor and the configuration of the programmable threshold transistor can be designed to operate with the selected current level and a specified sensing range.

The transistor 35 can be implemented using a MOS transistor, having an n-channel or a p-channel, configured to operate as a switch that provides a low resistance path when on, effectively bypassing the programmable resistor, so that that the voltage drop across the cell is very small; and that provides a high resistance path when off, effectively blocking current through the switch, so that the voltage drop across the cell is a function primarily of the resistance of the programmable resistance and the current through the cell.

FIG. 3 is a schematic diagram of an array of variable resistance cells, where each of the cells in the array comprises a transistor (e.g. 12) and a programmable resistor (e.g. 14) connected in parallel. In this illustration, the array includes four strings of variable resistance cells, where each string comprises four variable resistance cells in series between a summing node $SUM_1$ to $SUM_4$, and a reference line, such as ground (e.g. 26). Four word lines $WL_1$ to $WL_4$ are coupled to the control terminals of the variable resistance cells in each of the strings. As indicated in the figure, there can be any number of columns and summing nodes up to $SUM_n$, and any number of word lines up to $WL_m$. The variable resistance cells at column n and row m have weights $W_{nm}$ set as a function of the threshold $V_t$ of the cell, the programmed resistance $R_{nm}$ of the resistor in the cell, and the current $I_n$ in the column.

A voltage applied to the word lines corresponds to the variable inputs $X_1$ to $X_4, \ldots X_m$. In this manner, the variable resistance of each of the variable resistance cells in the strings is a function of a voltage applied on the word line to the gate of the cell, a threshold of the transistor in the cell, the current in the cell, and the programmed resistance of the resistor.

The summing nodes ($SUM_1$ to $SUM_4, \ldots SUM_4$) are coupled to a voltage sensing sense amplifier to generate a signal representing the sum-of-products output of each of the strings. A current source 21-24 is coupled to each of the strings to apply a constant current, in a representative example, to each string during the sensing operation.

Figure 4:
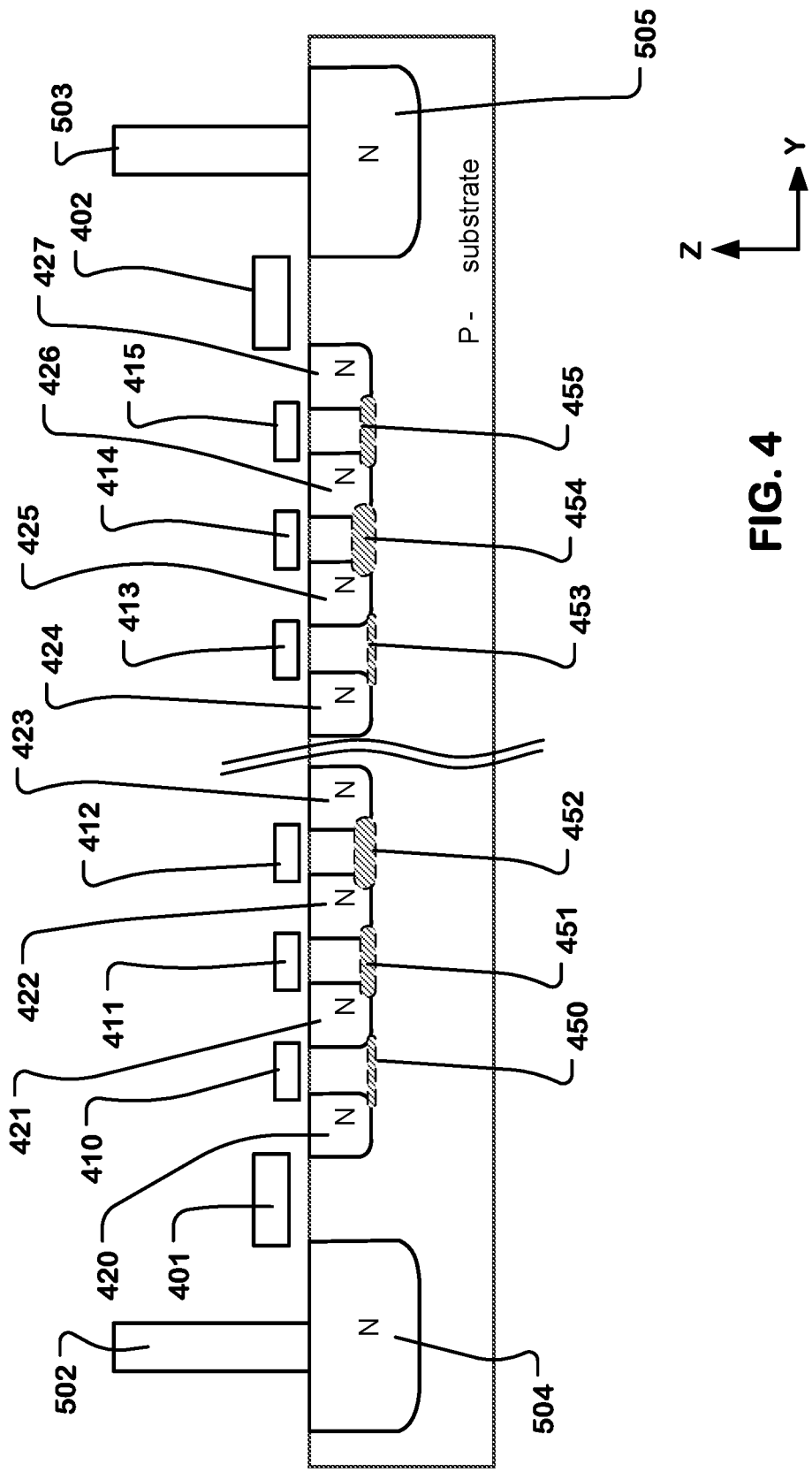
FIG. 4 is a cross-section of variable resistance cells arranged in series in a NAND-like structure implemented using programmable buried implant resistors.

FIG. 4 shows a simplified cross-section of a substrate in which a series-connected string 400 of variable resistance cells is formed. The gate stacks 410-415 overlie the substrate including gate dielectric layers of MOS transistors and gates that can be elements of word lines, extending in a direction perpendicular to the drawing page. In representative implementations, there may be for example 32 or 64 active word lines. In some embodiments, the series-connected strings may include a smaller number of active word lines or a larger number as suits a particular implementation. In some cases, there may be one or more dummy word lines which can be on opposing ends of the strings as is typical for example in high density NAND flash memory. Dummy word lines can be implemented for manufacturing quality or biasing purposes but not used in the sum-of-products operations of the string.

In this example, the substrate is a p-type substrate, and current carrying terminals (i.e. source/drain terminals) of the variable resistance cells are implemented by n-type implants 420-427. In some high density embodiments, implants are not used in current carrying terminals between the cells, so the current carrying terminals rely on inversion for charge carriers as in the channel regions. No contacts are made directly to the current carrying terminals between all the cells the embodiment illustrated. However, in some embodiments, contacts can be placed periodically along the string.

String select word lines 401 and 402 are disposed on opposing ends of the series-connected strings. Active regions 504 and 505 comprise n-type implants in the substrate used for bit line and common source line connections for the series-connected strings. The active regions 504 and 505 can be deeper implants or higher conductivity implants than the current carrying terminals of the variable resistance cells. A bit line contact 502 connects the active region 504 to a bit line in an overlying patterned conductor layer. A source line contact 503 connects the active region 505 to a source line in an overlying patterned conductor layer.

Buried implant resistors 450-455 are implemented extending in this example between the pairs of adjacent implants among the implants 420-427 which act as current carrying terminals of the cells in the string, each extending in parallel with the transistor channel regions of the corresponding cells in the string. The resistances of the resistors 450-455 are programmed during manufacture by implant dosage, implant depth and other factors that impact the resistivity and geometry of the diffusion region (represented in the figure by the variant thicknesses of the buried implant resistors 450-455) according to a program of values to be used, which can be weights of terms in sum-of-products operations.

Embodiments of sum-of-products arrays utilizing variable resistance cells can have very large arrays, including arrays having thousands or millions of variable resistance cells. Manufacturing techniques that are utilized for large-scale NAND devices can be applied, with the addition of steps for implementation of the buried implant resistors or other resistor structures, in the manufacturing of large sum-of-products arrays implemented in NAND-like structures as shown in FIG. 4.

Figure 5:
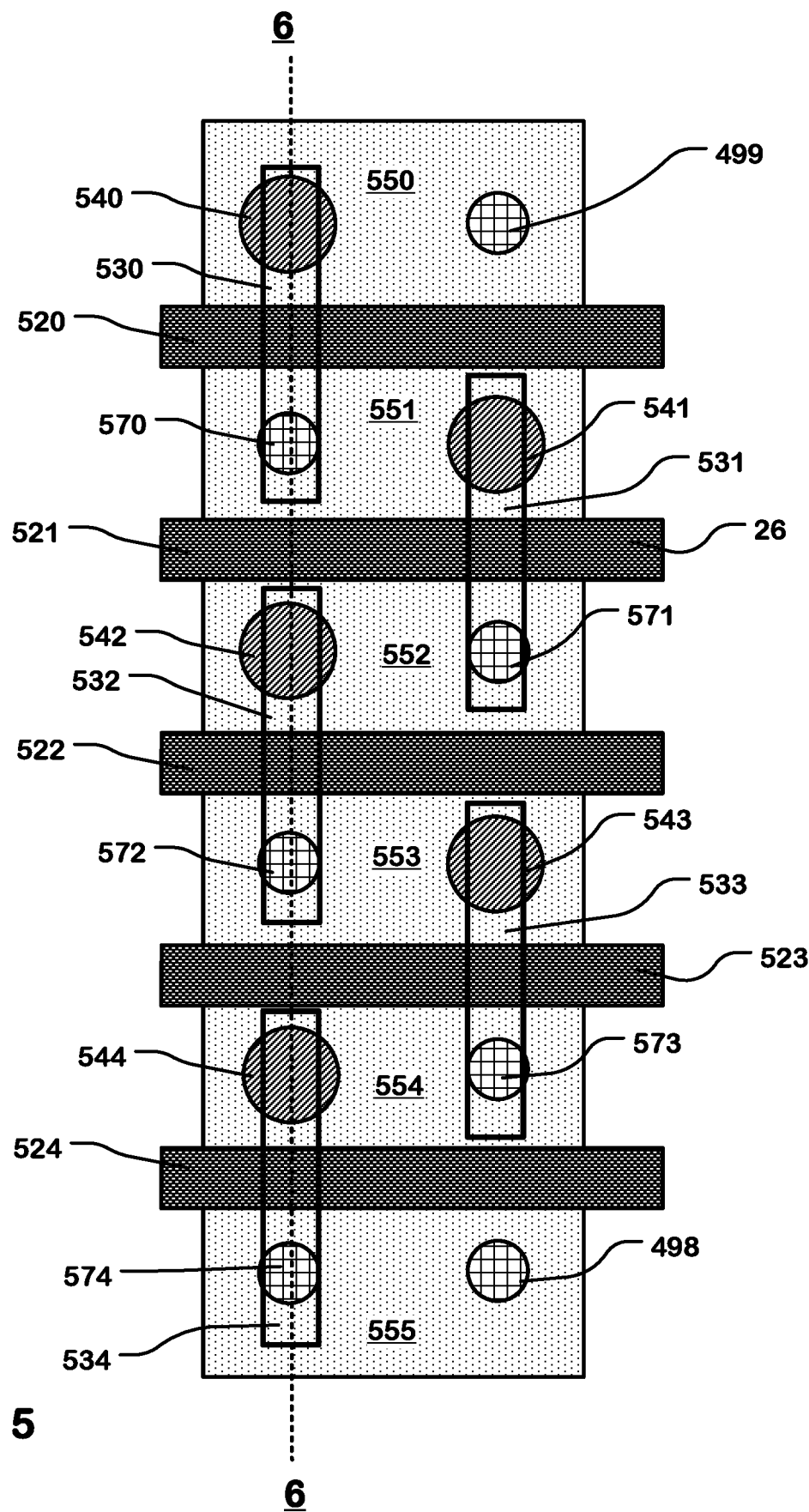
FIG. 5 is a layout view of variable resistance cells arranged in series, implemented using programmable resistors as components of interlayer contacts.
Figure 6:
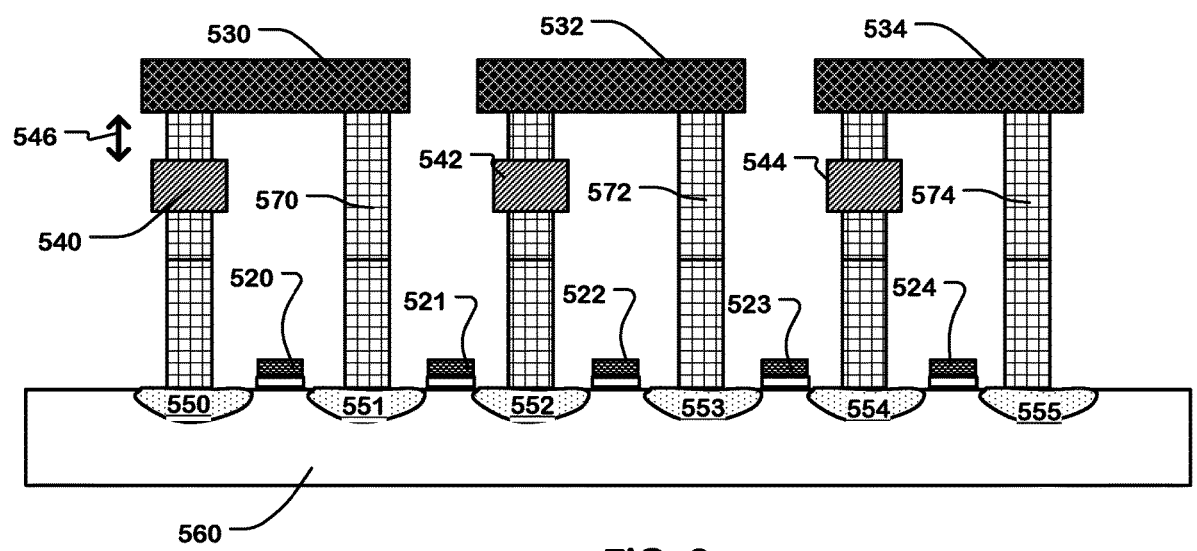
FIG. 6 is a cross-section view of one embodiment of variable resistance cells usable in the layout of FIG. 5.

FIG. 5 showing a layout view, and FIG. 6 showing a cross-section taken on line 6-6 of FIG. 5, illustrate another structure that can be used to implement a string of variable resistance cells for use in sum-of-products arrays. The structure includes a sequence of current conducting terminals 550-555, which act as source/drain terminals of a sequence of five transistors in this illustration. The gates of the five transistors are provided on word lines 520-524. Contacts 498, 499 connect to overlying conductors, which can connect to other segments of a string, or to peripheral circuitry supporting the sum-of-products configuration. Parallel resistors are implemented in each of the cells using a current path that bridges the transistor. In the cell between terminals 550 and 551, a first contact including a programmable resistor 540 is in electrical contact with the region of terminal 550, a second contact which can be a standard inter-layer connector 570 such as a tungsten plug or the like, is in electrical contact with the region of terminal 551. An overlying bridge element 530 which comprises a segment of a patterned metal layer connects the programmable resistor 540 with the interlayer connector 570. A second cell is formed between terminals 551 and 552, including programmable resistor 541, contact 571, and segment 531. A third cell is formed between terminals 552 and 553, including programmable resistor 542, contact 572, and segment 532. A fourth cell is formed between terminals 553 and 554, including programmable resistor 543, contact 573 and segment 533. A fifth cell is formed between terminals 554 and 555, including programmable resistor 544, contact 574 and segment 534. These cells are laid out in an interleaved fashion which can reduce vertical pitch of the string.

FIG. 6 illustrates a cross-section taken along the lines 6-6 of FIG. 5. The structures formed in a substrate 560, elements described with reference to FIG. 5, are given the same reference numerals in FIG. 6. The terminals 550-555 are formed by implant diffusion regions in the substrate 560 in this example. The programmable resistors 540, 542, 544 shown in FIG. 6 are disposed in an interlayer connector spaced away by the distance 561 from the overlying bridge element 530, 532, 534 of the patterned metal forming the bridge of the cell.

The programmable resistors 540-544 in an implementation like that of FIGS. 5 and 6, and in other configurations of variable resistance cells, can comprise transition metal oxide layers, for example, which can be programmed to variable resistance values using programming pulses and verify operations as is typical for resistive RAM implementations. For example, the programmable resistors can comprise two-terminal devices having first and second electrodes, with a metal oxide in between that can be programmed to multiple resistance values. In such embodiments, the metal-oxide layer may comprise one or more metal oxides from the group of tungsten oxide, titanium oxide, nickel oxide, aluminum oxide, copper oxide, zirconium oxide, niobium oxide, tantalum oxide, titanium nickel oxide, Cr-doped $SrZrO_3$, Cr-doped $SrTiO_3$, PCMO and LaCaMnO. In some embodiments, the programmable resistive element between the electrodes may comprise WO/Cu or Ag, TiO/Cu or Ag, NiO/Cu or Ag, AlO/Cu or Ag, CuO/Cu or Ag, ZrO/Cu or Ag, NbO/Cu or Ag, TaO/Cu or Ag, TiNO/Cu or Ag, Cr-doped $SrZrO_3$/Cu or Ag, Cr-doped $SrTiO_3$/Cu or Ag, PCMO/CU or Ag, LaCaMnO/Cu or Ag, and $SiO_2$/Cu or Ag.

In other embodiments, the programmable resistors 540-544 can comprise phase change memory elements. Embodiments of the phase change materials include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. In other examples, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties.

Chalcogenides and other phase change materials are doped with impurities, in some embodiments, to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Other programmable resistance structures, as alternative to those based on phase change cells and metal oxide cells described above, include solid state electrolyte (conductive bridge) memory cells and magnetoresistive memory cells, spin transfer torque material, and magnetic material, and can be applicable to the present technology.

The current can be directed through the programmable resistors target of programming the resistance of the programmable resistor in the target cell by turning off the parallel transistor in the target cell, for the purposes of such programming, while turning on the parallel transistors in the other cells in the string.

Figure 7:
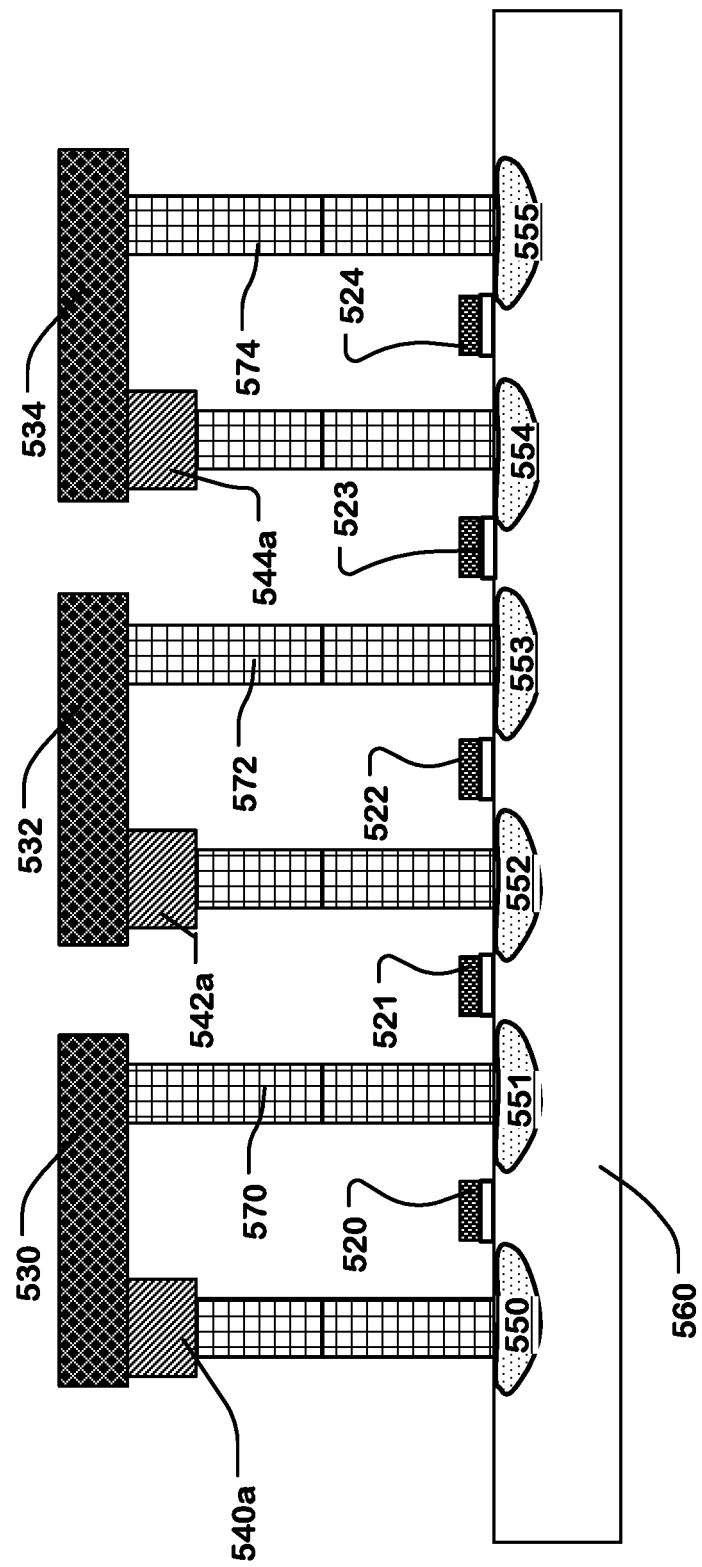
FIG. 7 is a cross-section view of another embodiment of variable resistance cells usable in the layout of FIG. 5.

FIG. 7 illustrates a cross-section of an alternative structure, which can be utilized with the layout of FIG. 5. The elements of FIG. 7 that are the same as those used in FIG. 6 are given the same reference numbers. In this structure, the programmable resistors 540a, 542a and 544a are disposed at the interface between the overlying bridge elements 530, 532, 534 and underlying interlayer connectors. Thus, they do not have the offset distance 546 as seen in FIG. 6. The programmable resistors 540a, 542a and 544a can be implemented using the technologies discussed with reference to FIG. 6.

FIGS. 6 and 7 illustrate alternative configurations of variable resistance cells showing how the elements might be configured on an integrated circuit in particular embodiments. Other configurations are possible as well.

Figure 8:
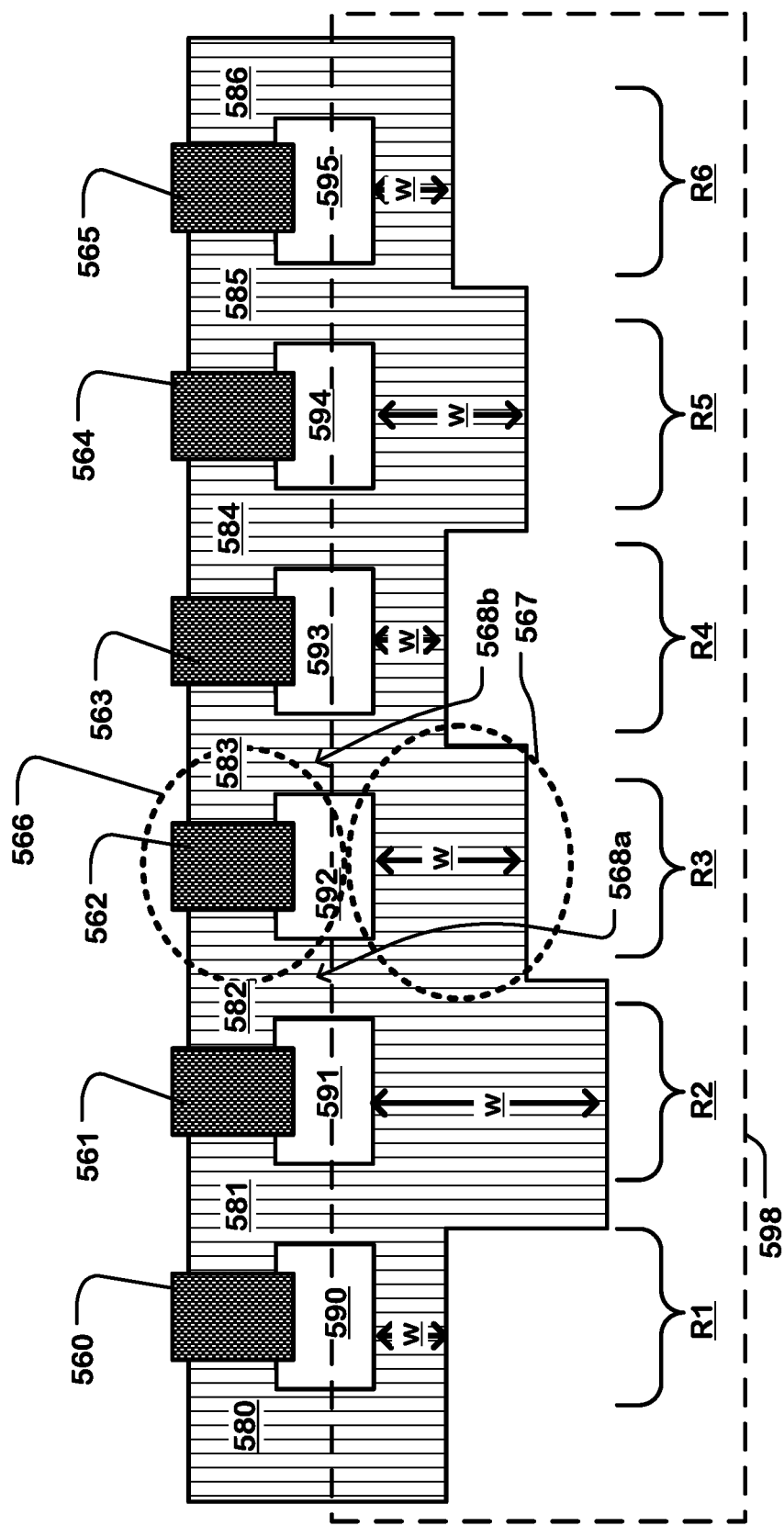
FIG. 8 is a layout view of variable resistance cells arranged in series, implemented using diffusion regions of variant geometries as programmable resistors.

FIG. 8 illustrates an alternative in which the programmable resistor of the cell is an implant diffusion region, programmed during manufacture to have variant geometries and doping concentrations to provide programmed resistances in the cells. FIG. 8 is a layout view of a sequence of variable resistance cells, including programmable resistors that comprise implant diffusion regions of variant geometries in parallel with the transistors of the cells.

In this example, a sequence of cells includes six transistors having gates 560-565. Source/drain regions for the transistors are in the current carrying terminals 580-586. Thus, a transistor (e.g. 566) of a variable resistance cell is formed by current carrying terminals 582 and 583, with the gate element 562. The gates can be elements of word lines and a large array as discussed above.

Parallel programmable resistors are implemented in this example, by parallel diffusion regions separated from the channel regions of the transistors by isolation structures, such as shallow trench isolation elements 590-595 adjacent to the channel regions of the transistors in each cell. Variant geometries of implant diffusion regions, forming parallel resistors, are connected to the source/drain regions of the transistors by extensions of the diffusion region between the isolation elements 590-595. In the illustration, to establish the variant geometries, the widths of the implant regions are variant as represented by the dimension arrows labeled "w". Thus, a programmable resistor (e.g. 567) is connected in parallel with the transistor 566 by the extensions of the diffusion region 568a and 568b on opposing sides of the isolation element 592.

The implant concentration in the source/drain regions of the transistors can be higher than that of the programmable resistor regions. This can be accomplished using an implant mask 598 having an area covering the resistor regions. For example, the gate structures can be formed, and then an implant executed while the implant mask 598 blocks the implant in the area of the programmable resistors. In a second implant stage, the implant mask is removed, and the pattern of the programmable resistors is set using another implant mask according to the program to be implemented. The second implant is executed establishing the implant concentration and geometry for the programmable resistors. In this way, programmable resistors having variant geometries and optionally variant implant concentrations can be programmed during manufacture.

FIGS. 4 and 8 illustrate examples of variable resistance cells that comprise a diffusion region in a substrate having proximal and distal areas (e.g. terminals 582, 583), a first leg between the proximal and distal areas and a second leg between the proximal and distal areas. The first leg includes a channel region, and including a gate conductor over the channel region of the first leg forming a cell transistor. The second leg has a resistance that is a function of the doping profile and layout profile of the second leg to form a programmable cell resistor in parallel with the cell transistor.

Figure 9:
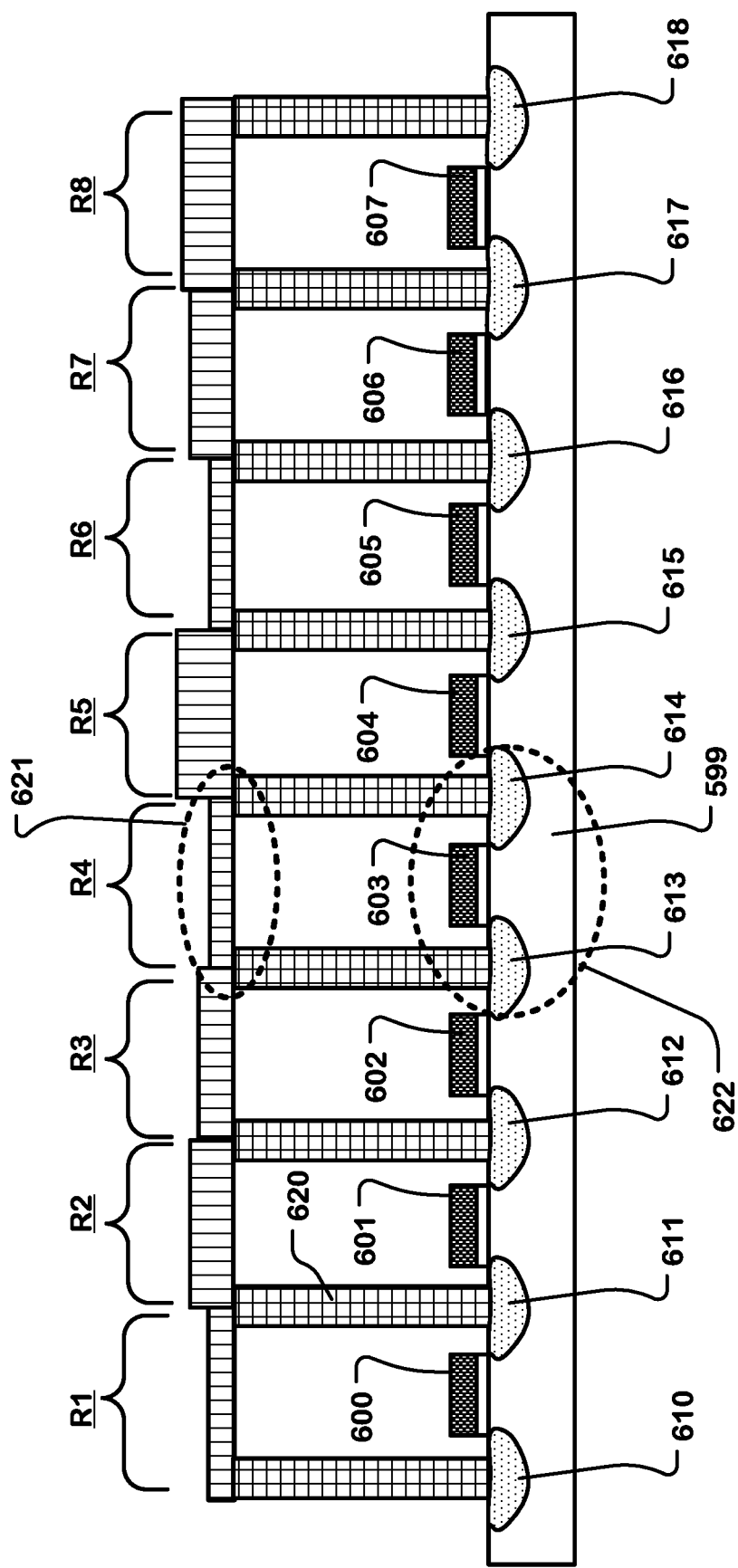
FIG. 9 is a layout view of variable resistance cells arranged in series, implemented using a patterned resistor layer overlying the transistors including resistors of variant geometries as programmable resistors.

FIG. 9 illustrates yet another structure for variable resistance cells that can be used in a sum-of-products array as described herein. In this embodiment, a series of cells is implemented in a substrate 599. The substrate includes a plurality of current carrying terminals 610-618 for corresponding cells. Word lines 600-607 are disposed in channel regions between corresponding pairs of the current carrying terminals 610-618. Interlayer contacts (e.g. 620) are connected to current carrying terminals 610-618, and make current paths to corresponding programmable resistor elements R1-R8, which bridge corresponding transistors in the cells. Thus, for example, a single variable resistance cell in the series includes the programmable resistor R4 implemented by a resistor element 621 which bridges the transistor 622 that includes gate in word line 603, and has a source/drain in the current carrying terminal 613, and another source/drain in the current carrying terminal 614.

The programmable resistors R1-R8 can comprise resistive materials of variant geometries, including variant thicknesses, varying widths in the layout, and so on. Example resistive materials can comprise various metal nitrides and carbides for example. The variant geometries can be implemented using etching sequences with etch masks that are programmed to define the programmable resistances for the cells.

FIGS. 5-7 and 9 illustrate examples of variable resistance cells that comprise a diffusion region having proximal and distal areas, and a channel region between the proximal and distal areas, and including a gate conductor over the channel region, forming a cell transistor, a current path from the proximal area to the distal area comprising a first interlayer conductor, a bridge conductor in an overlying patterned conductor layer, and a second interlayer conductor, and a programmable resistance memory element forming a programmable cell resistor in parallel with the cell transistor. The programmable resistor can be disposed in the interlayer conductors or in the bridge conductor as described above, or elsewhere in the current flow path of the cell.

Figure 10:
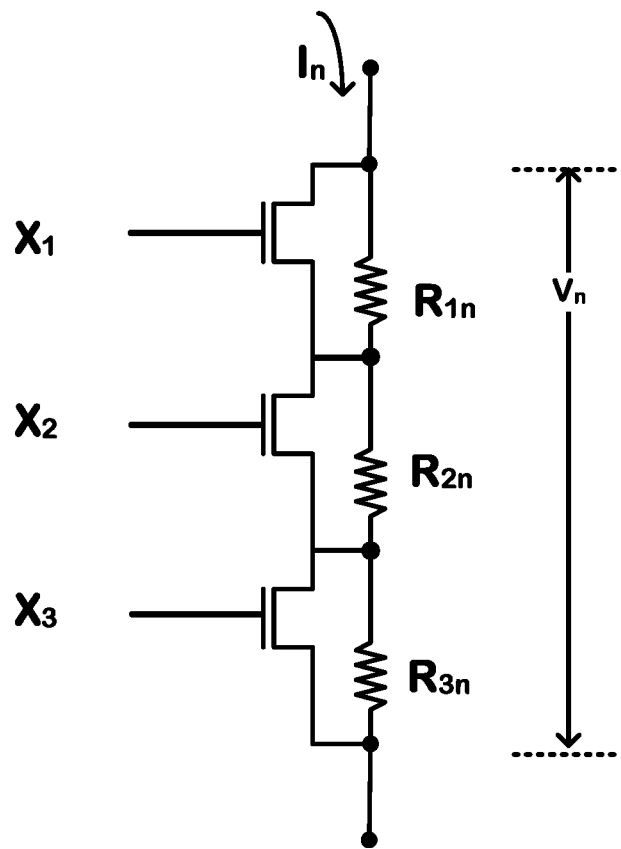
FIG. 10 illustrates a string of variable resistance cells configured for implementation of a sum-of-products operation.

FIG. 10 is a schematic illustration of a plurality of variable resistance cells connected in series which can be used to produce the sum-of-products operation. In this example, only three cells are shown in series. In other embodiments, there can be a large number of cells in series.

The first cell in this example receives an input $X_1$ and has a weight defined by the programmable resistance $R_{1n}$ of that cell 1 of column "n" in the array. The second cell in this example receives an input $X_2$ and has a weight defined by the programmable resistance $R_{2n}$ of that cell 2 of column "n" in the array. The third cell in this example receives an input $X_3$ and has a weight defined by the programmable resistance $R_{3n}$ of that cell 3 of column "n" in the array. There can be any number of cells in the string so that any particular cell in the array can be characterized as having a weight determined by the programmable resistance $R_{mn}$ at row "m" and column "n".

The voltage drop $V_n$ for this column represents the sum of voltages across each cell, which in turn are a function of $X_i$ and $R_{mn}$.

For example, the voltage drop can be characterized by the following equation:

$$V_n = I_n*(T_{r,1}//R_{1n}) + I_n*(T_{r,2}//R_{2n}) + I_n*(T_{r,3}//R_{3n})$$

In this equation, the output voltage $V_n$ is equal to the current $I_n$ applied to the column times the parallel resistance of the transistor and programmable resistor of each cell. The parallel resistance depends on the input value $X_m$, which turns on or turns off the transistor of the cell. If the input $X_m$ is equal to zero, then the resistance is determined by the programmable resistor. If the input $X_m$ is equal to one, then the transistor is turned on, and the resistance of the cell is low, determined primarily by the resistance of the transistor, which can be operated in saturation to achieve very low resistance.

Thus for example, if the inputs $[X_1, X_2, X_3]$ equal $[0\ 1\ 0]$, then the equation can be expressed as follows:

$$V_n = I_n*(T_{r,OFF}R_{1n}) + I_n*(T_{r,ON}//R_{2n}) + I_n*(T_{r,OFF}//R_{3n})$$

As can be seen, this is the form of a sum-of-products operation over the cells in the string.

Figure 11:
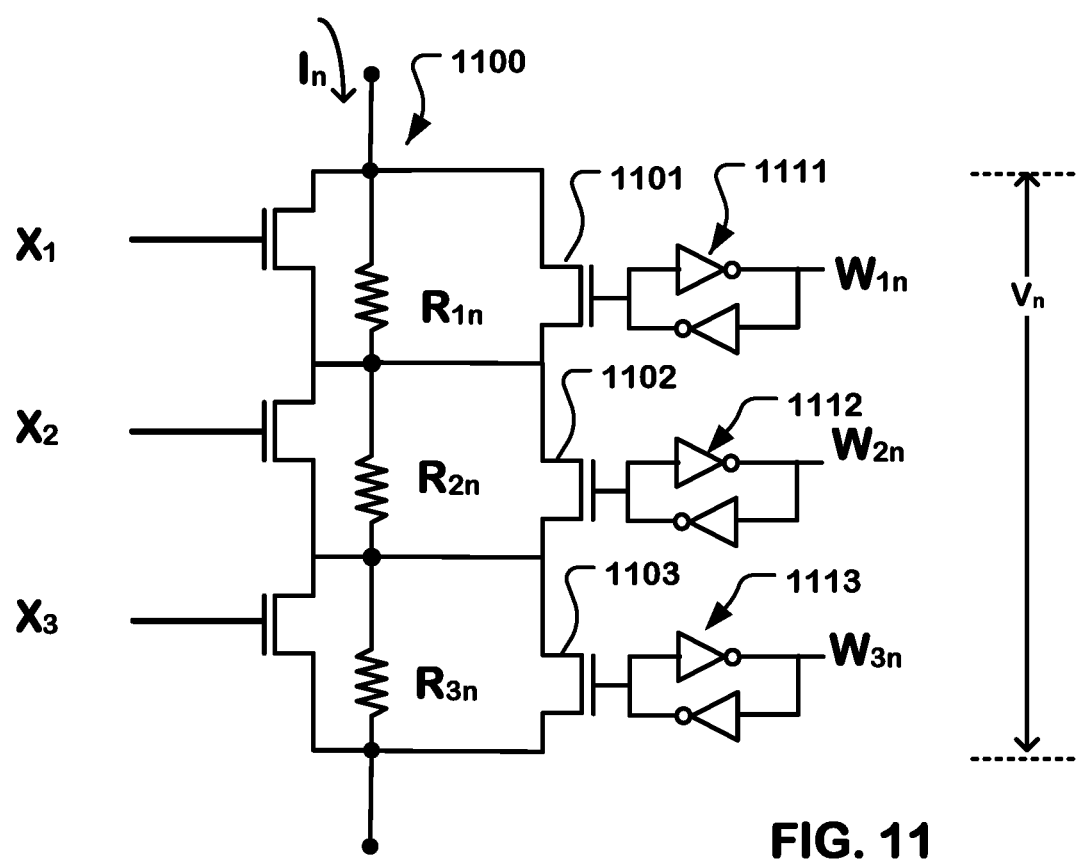
FIG. 11 illustrates an embodiment of a variable resistance cell including an SRAM control element.

FIG. 11 illustrates another example of a variable resistance cell, in which an SRAM is applied to store a weight value which is usable to change the equivalent resistance value of the combination and the variable resistance cell. Thus, each cell comprises a transistor in parallel with a programmable resistor $R_{1n}$, $R_{2n}$, $R_{3n}$ as discussed above with reference to FIG. 10 to implement a string 1100 of variable resistance cells having inputs $X_1$ to $X_3$. In addition, each cell includes a second transistor (1101, 1102, 1103). The gate of the second transistor in each cell is coupled to a corresponding SRAM cell (1111, 1112, 1113). A weight value $W_{1n}$, $W_{2n}$, $W_{3n}$ can be dynamically stored in the SRAM cells to change the variable resistance according to different sum-of-products operations to be executed.

Figure 12:
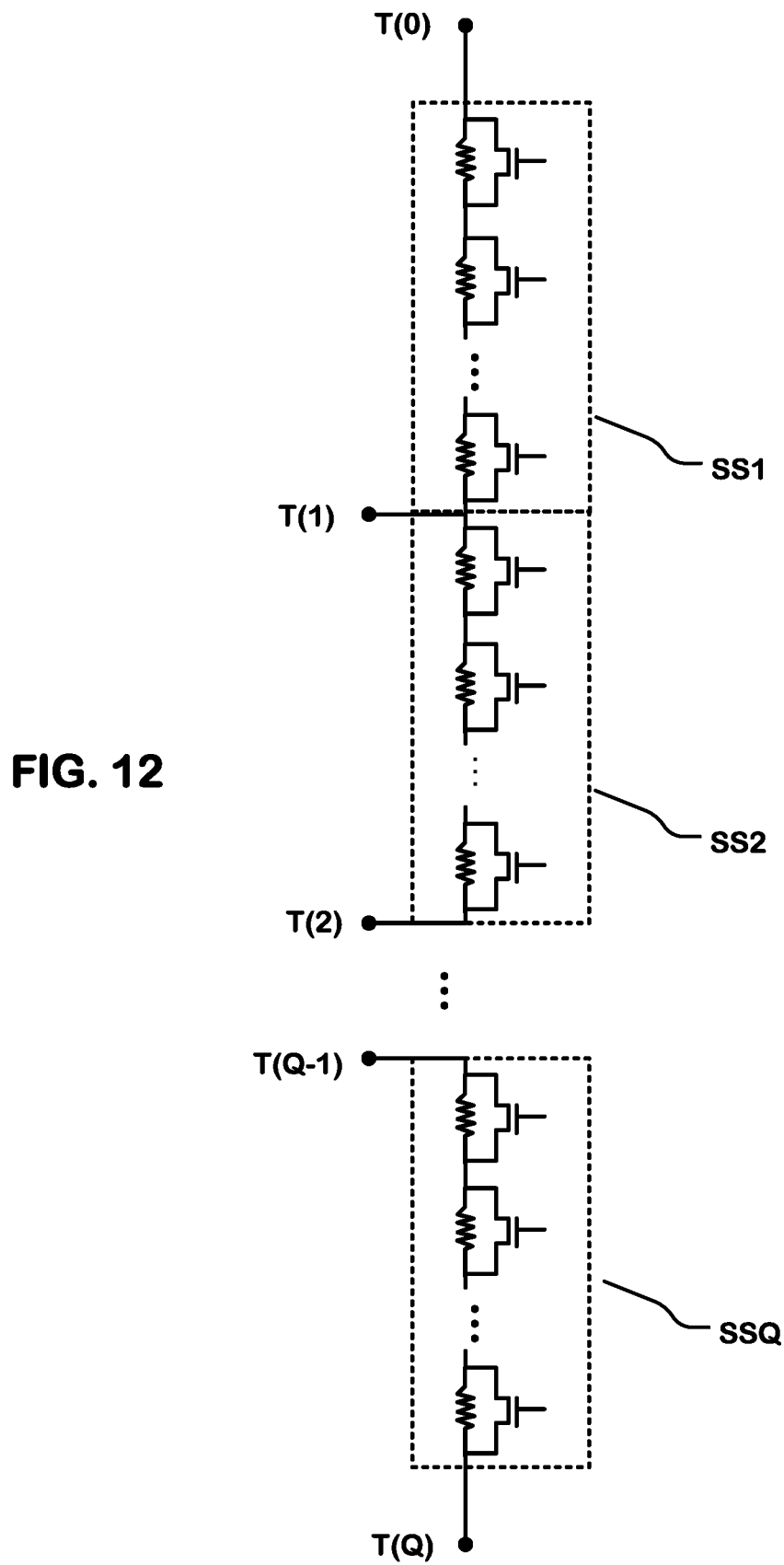
FIG. 12 illustrates a segmented, long string of variable resistance cells configured for implementation of a sum-of-products operation.

FIG. 12 illustrates a segmented string of variable resistance cells which can be implemented in some embodiments. As mentioned above, a string in an array can comprise a relatively large number of variable resistance cells. In the embodiment shown in FIG. 11, string resistance loading can be reduced by dividing it into multiple sub-strings SS1-SSQ. The divisions are implemented by providing contacts T(0) to T(Q) along the string. The first sub-string SS1 is connected between contacts T(0) and T(1). The second sub-string SS2 is connected between contacts T(1) and T(2). The pattern continues until the final substring SSQ is connected between contacts T(Q−1) and T(Q).

Control circuitry on the integrated circuit can utilize the contacts distributed along the string in order to manage string resistance loading for various operations. For example, in order to program cells in the first substring SS1, a high voltage on terminal T(0) and a low voltage on terminals T(1) to terminal T(Q) can be applied. Current can be routed between terminals T(0) and T(1) for the purposes of the operations in the first substring. In order to program cells in the second substring SS2, a high voltage on terminal T(1) and a low voltage on terminals T(0) and T(2) to T(Q) can be applied. Current can be routed between terminals T(1) and T(2) for the purposes of the operations in the second substring.

Figure 13:
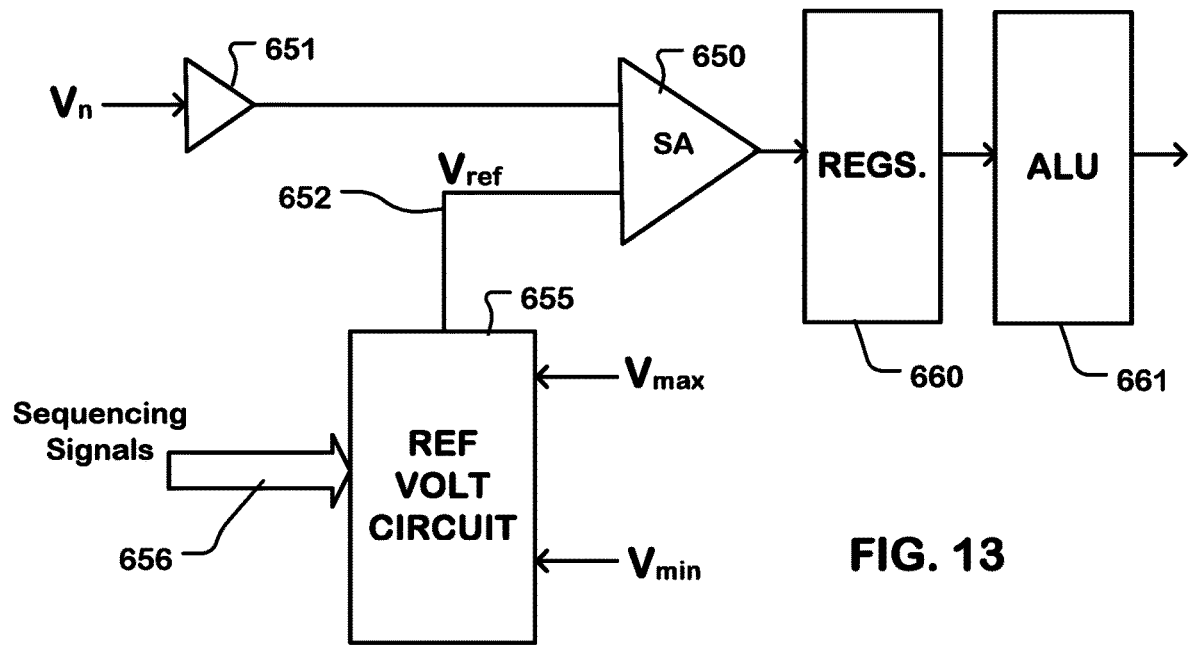
FIG. 13 is a simplified block diagram of sensing circuitry that can be utilized with an array of variable resistance cells for the purposes of sum-of-products operations.

FIG. 13 is a block diagram of sensing circuitry that can be utilized with an array of variable resistance cells configured for sum-of-products operation, with voltage sensing as described above. Sensing circuitry in this example includes a sense amplifier 650 implemented for example using an operational amplifier or other type of comparator. The inputs to the sense amplifier 650 include the voltage $v_n$ and a reference voltage $V_{ref}$ on line 652. The voltage $v_n$ is developed on a selected column, and can be delivered through a buffer 651. The buffer 651 can be implemented for example using a unity gain configured operational amplifier or other voltage-to-voltage amplifier. The reference voltage $V_{ref}$ on line 652 is provided by a reference voltage circuit 655, which is configured to sequence through a set of reference voltages corresponding to each of the voltage levels to be distinguished by the sense amplifier 650 in response to sequencing signals on line 656. The reference voltage circuit 655 can receive input voltages $V_{max}$ and $V_{min}$ which can determine minimum and maximum voltages to be developed on line 652 as the reference voltage $V_{ref}$.

Figure 14:
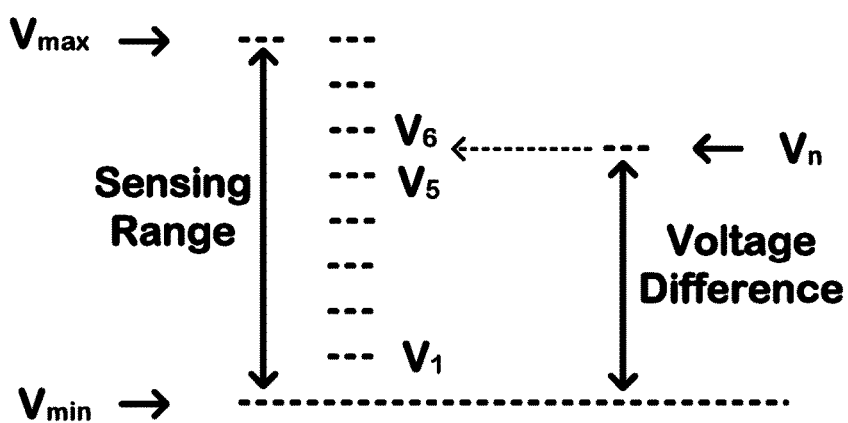
FIG. 14 is a heuristic diagram referred to for the purposes of describing the sensing operations using the circuit of FIG. 13.

FIG. 14 is a chart that illustrates heuristically the sensing operation. Given voltages $V_{max}$ and $V_{min}$, circuitry of FIG. 14 can generate reference voltages at a plurality of levels within a sensing range as indicated by the chart. The voltage $V_n$ developed on a selected column in the array can fall at a level within the sensing range that has a voltage difference above the voltage $V_{min}$. The sensing circuitry determines a level for the voltage $V_n$, which in this case is higher than each of the reference voltages $V_1$ to $V_5$ and lower than the reference voltage $V_6$. It can therefore assign a digital value to the voltage $V_n$ corresponding to the reference voltage $V_6$.

The output of the sense amplifier 650 comprises a sequence of signals that correspond with the input reference voltage level. These signals can be stored in registers 660, that are provided to an arithmetic logic unit 661 or other type of processing circuitry like a digital signal processor, general purpose processor, or the like, where further arithmetic operations can be executed to further the sum-of-products operations. For example, the outputs generated on a plurality of columns of the array can be combined for the purposes of generating a single term of the sum-of-products operation, depending on how the array of variable resistance cells is configured as discussed below.

Figure 15:
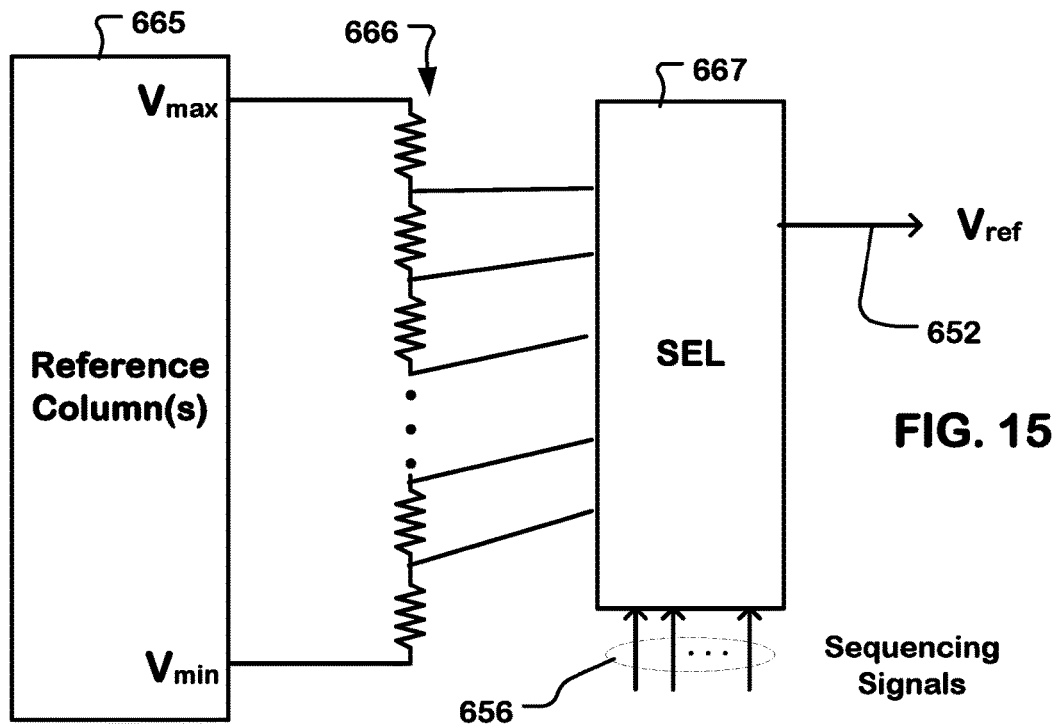
FIG. 15 is a simplified diagram of a reference voltage circuit that can be utilized with sensing circuitry like that of FIG. 13.

FIG. 15 is a block diagram of a reference voltage circuit which can be utilized with a sense amplifier arrangement like that of FIG. 12. In the diagram of FIG. 14, a reference column or reference columns 665 in the array of variable resistance cells, using cell structures like those used in the array, can be arranged to provide one or both of the voltages $V_{max}$ and $V_{min}$. Voltages $V_{max}$ and $V_{min}$ in this example are applied to a resistive voltage divider 666, which produces a plurality of reference voltage levels at nodes between the resistors in the divider 666. The nodes responding to the reference voltage levels are coupled to a selector 667. The selector 667 is responsive to the sequencing signals on line 656 to provide a sequence of reference voltages $V_{ref}$ on line 652, coupled to the sense amplifier 650 in the configuration of FIG. 14.

Figure 16:
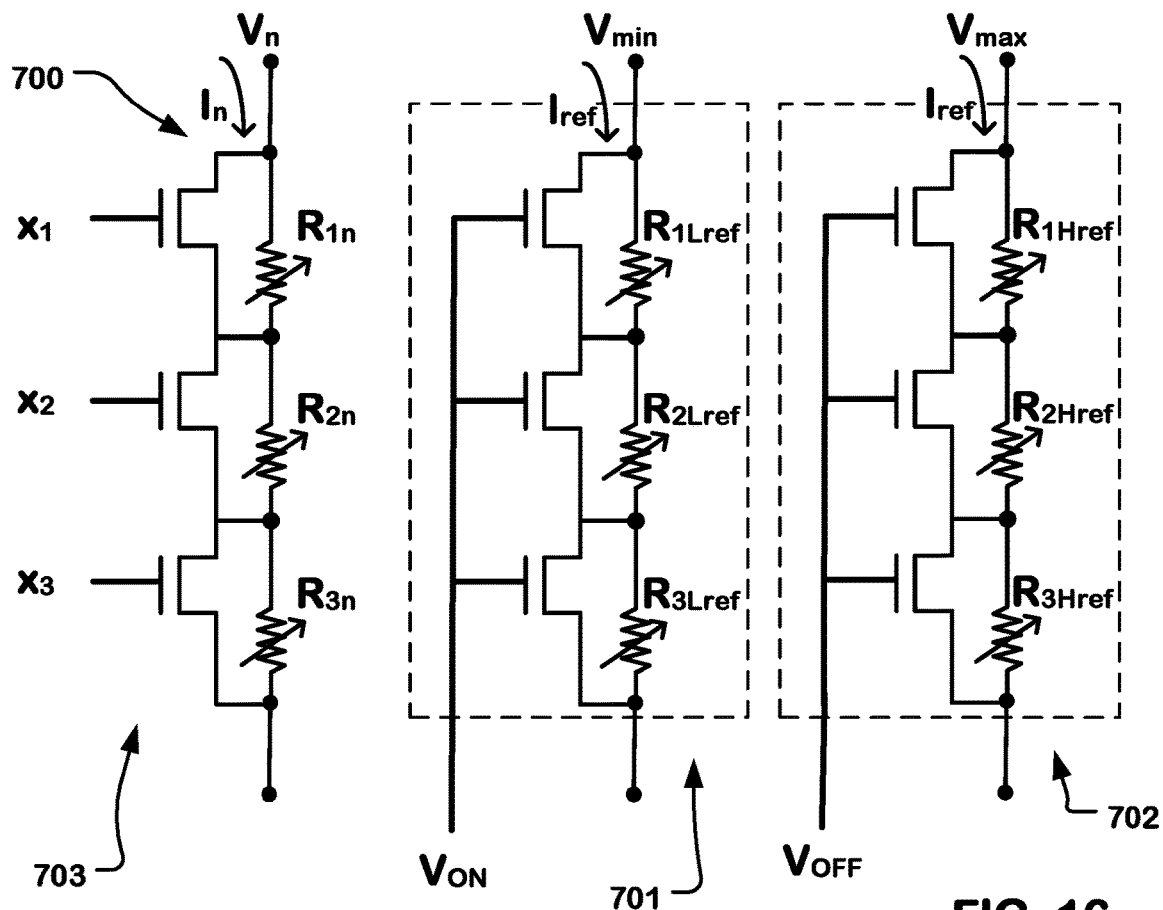
FIG. 16 is a schematic view of an embodiment including reference columns for $V_{min}$ and $V_{max}$ usable with a circuit like that of FIG. 15.

FIG. 16 illustrates an example configuration in which both the voltages $V_{min}$ and $V_{max}$ are generated. In this configuration, an operating string 700 in an operating column n includes three cells. Thus, the operating column n is configured for a sum-of-products operation, where the cells in the operating string 700 have inputs $X_1$ to $X_3$ and weights determined by resistances $R_{1n}$, $R_{2n}$ and $R_{3n}$. The resistances are programmed into the operating string 700 according to the terms of the sum-of-products operation to be executed. The voltage generated by a current $I_n$ through the string is designated $V_n$.

A $V_{min}$ reference column includes a reference string 701 in the region 703 of the array. The reference string 701 includes three cells that can have electrical characteristics matching those of the three cells used in the operating string 700. In order to generate the voltage $V_{min}$, the weights of the cells in the reference string 701, designated $R_{1Lref}$, $R_{2Lref}$ and $R_{3Lref}$, are all set to match those of the operating column, and the input value (in this case "1") is set to turn on all the transistors in the cells. Assuming $I_{ref}$ is equal to $I_n$, the reference string 701 generates the small voltage drop in each cell, and the voltage $V_{min}$ in this example with three cells in the string, will be equal to about three times the small voltage drop of the cells (transistor on state) used in the operating string 700, when the transistor is on, bypassing the programmed resistors. With more cells in the string, the value of $V_{min}$ will be shifted accordingly.

A $V_{max}$ reference column includes a reference string 702 and unused cells in the region 703 of the array. The reference string 702 includes three cells that can have electrical characteristics matching those of the three cells used in the operating string 700. In order to generate the voltage $V_{max}$, the weights of the cells in the reference string 702, designated $R_{1Href}$, $R_{2Href}$ and $R_{3Href}$, are all set to the values of the programmable resistors in the operating string. The inputs to the cells in the $V_{max}$ reference column including string 702 are tied together and coupled to a voltage $V_{on}$ during operation so that the transistors in three cells in the column including the $V_{max}$ reference string 701 are turned off, and assuming $I_{ref}$ is equal to $I_n$, generate the large voltage drop of each cell (transistor off state) determined by its programmable resistance. Thus, the voltage $V_{max}$ in this example with three cells in the string, will be equal to about three times the large voltage drops of the programmed cells used in the operating string 700. With more cells in the string, the value of $V_{max}$ will be shifted accordingly.

Figure 17:
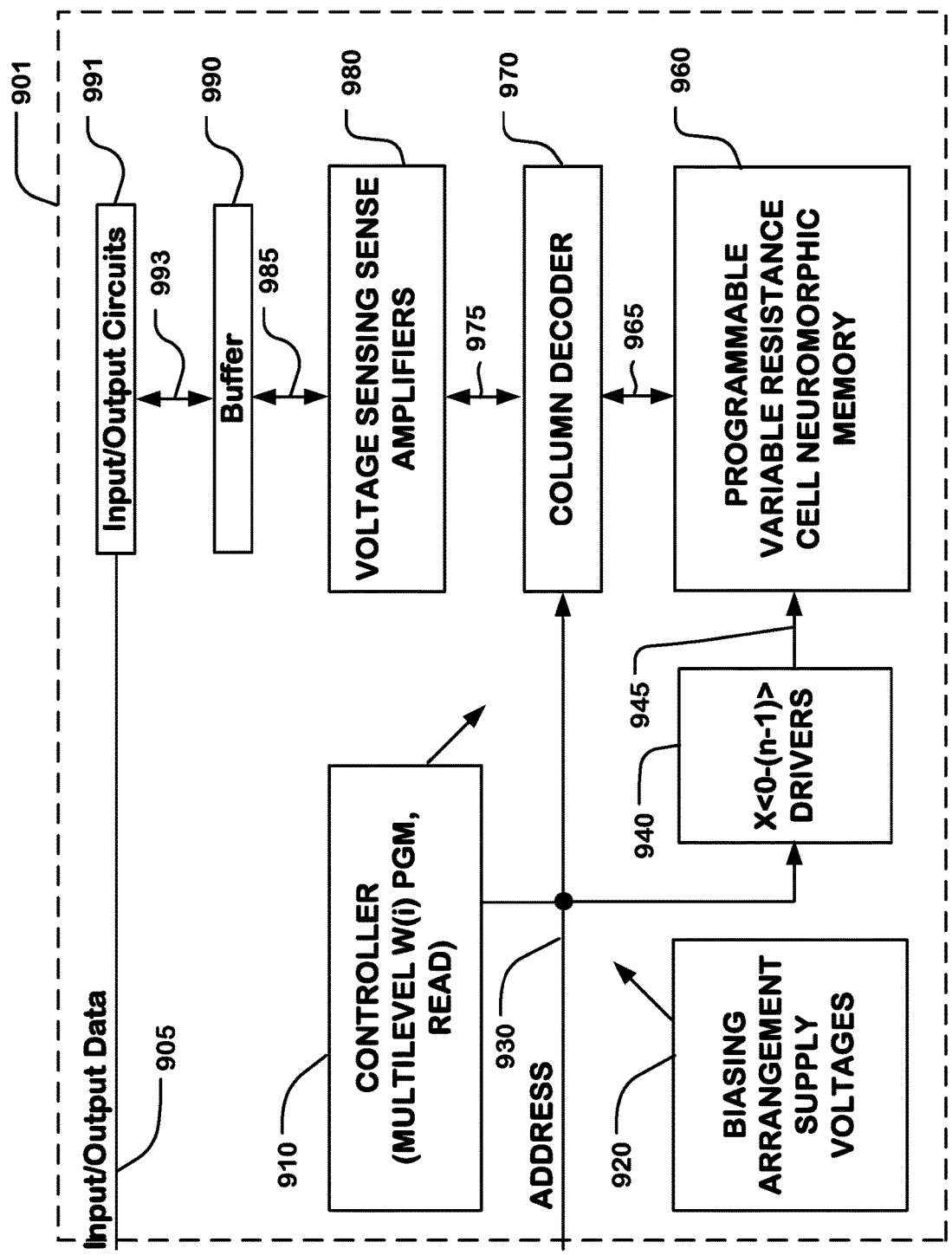
FIG. 17 is a simplified block diagram of a device including an array of variable resistance cells applied, for example, for neuromorphic memory.

FIG. 17 is a simplified chip block diagram of an integrated circuit 901 including a sum-of-products array with voltage sensing, and variable resistance cells such as described herein, configured as a neuromorphic memory array 960.

A word line driver 940 is coupled to a plurality of word lines 945. The driver comprises, for example, digital-to-analog converters, in some embodiments, that produce an input variable X(i) for each selected word line or, in the alternative, a binary word line driver can apply binary inputs. A column decoder 970 is coupled via lines 965 to one or more layers of strings of series-connected cells arranged along columns in the array 960 for selecting strings for reading sum-of-products data from, and writing parameter data to, the memory array 960. Addresses are supplied on bus 930 from control logic (controller) 910 to decoder 970 and driver 940. Voltage sensing sense amplifiers are coupled to the column decoder via lines 975, and are in turn coupled to buffer circuits 980. Current sources applying the load currents $I_n$ are coupled with the sensing circuits. A program buffer can be included with the sense amplifiers in circuits 980 to store program data for two-level or multiple-level programming of the programmable resistors in the cells. Also, the control logic 910 can include circuits for selectively applying program and inhibit voltages to the strings in the memory in response to the program data values in the program buffer to set the programmable resistances. In other embodiments the programmable resistors are in a programmed state, set during manufacture or in a one-time programming operation.

Sensed data from the sense amplifiers are supplied via second data lines 985 to data buffer 990, which is in turn coupled to input/output circuits 991 via a data path 993. The sense amplifiers can comprise operational amplifiers configured to apply unity gain or a desired gain level, and provide analog outputs to digital-to-analog converters or other signal processing or signal routing circuits. Additional arithmetic units and routing circuits can be included to provide for arrangement of multiple layers of strings of cells into neuromorphic circuits.

Also, arithmetic units and routing circuits can be included to provide for arrangement of the layers of strings into matrix multiplication units.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 17, control logic 910, using a bias arrangement state machine, controls the application of supply voltages generated or provided through the voltage supply or supplies in block 920, for sum-of-products read operations. In embodiments including programmable resistance elements such as metal oxide layers or phase change elements, the control logic controls parameter writing operations to set parameters, such as cell weights, represented by programmable resistances using erase, verify and program bias voltages. The control logic 910 is coupled to the buffer 990 and the memory array 960.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Figure 18:
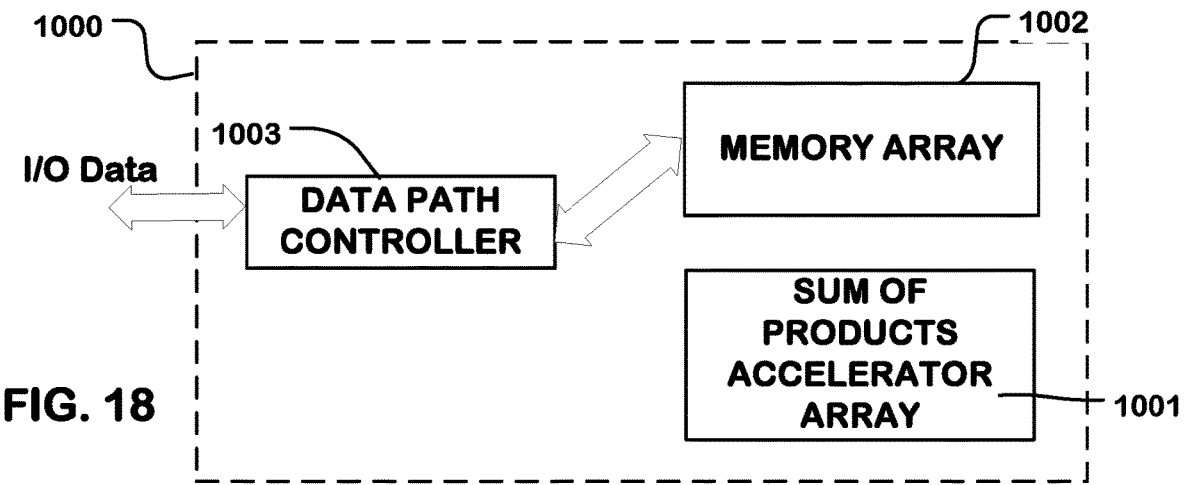
FIGS. 18-20 illustrate a system including a sum-of-products accelerator array, and various operations thereof.
Figure 19:
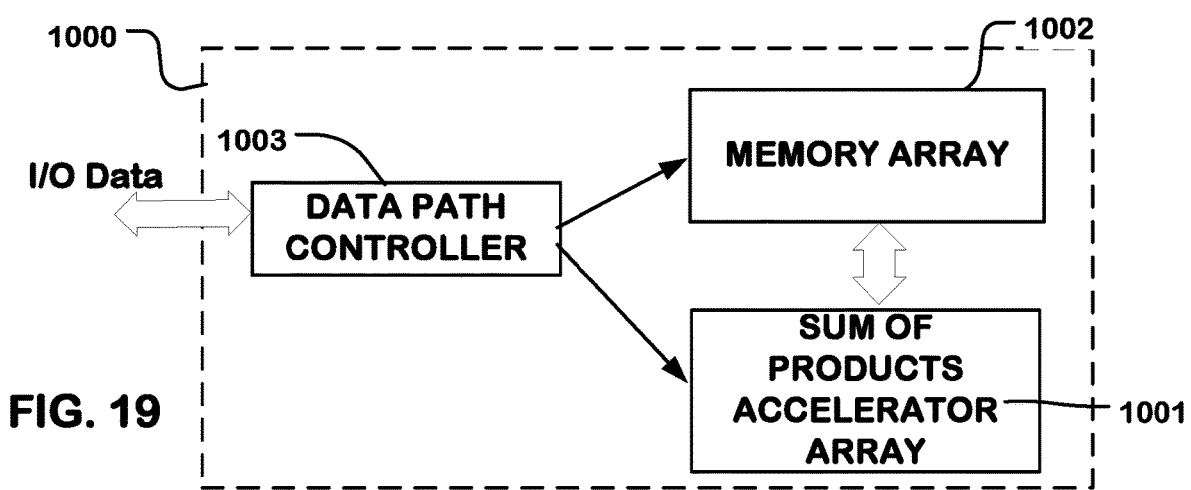
Figure 20:
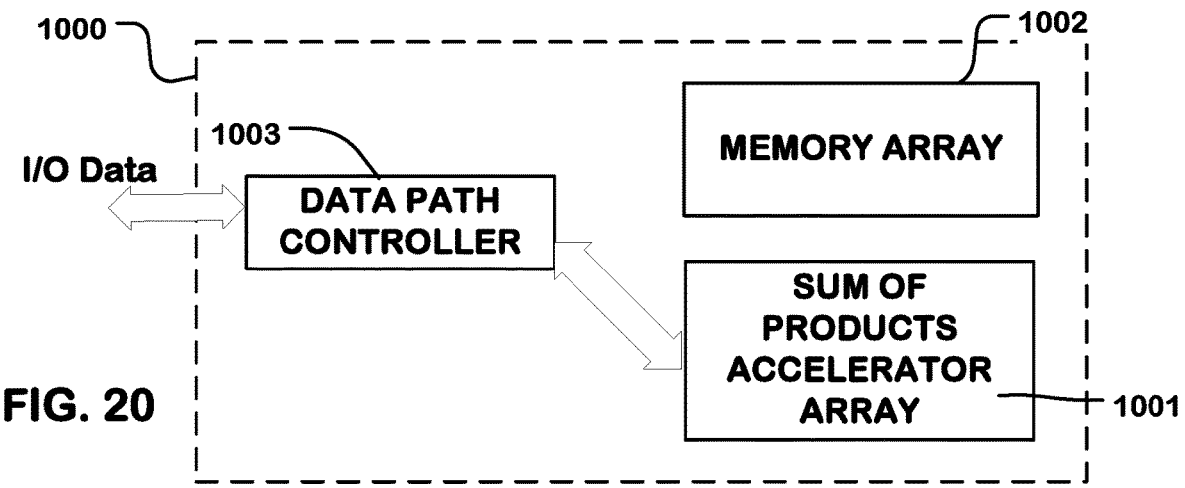

FIGS. 18-20 illustrate a configuration of system 1000 including a memory array 1002 and a sum-of-products accelerator array 1001 interconnected using a data path controller 1003. The sum-of-products accelerator array 1001 comprises an array of variable resistance cells according to any of the embodiments described above. The memory array can comprise a NAND flash array, an SRAM array, a DRAM array, a NOR flash array, or other type of memory that can be used in coordination with the sum-of-products accelerator array 1001.

The system can receive input/output data from outside the system as shown in FIG. 18, and route the data to the memory array. The data can include configuration data used to configure the functional sets of cells that implement the terms of one or more sum-of-products operations, weights for the functional sets in the array used for the operations, and input values for the sum-of-products operations.

As represented in FIG. 19, data from the memory array 1002 can be transferred to the sum-of-products accelerator array 1001, using a direct data path that can be controlled using the data path controller 1003. Alternatively, a data path through the data path controller 1003 can be used to transfer data from the memory array 1002 to the sum-of-products accelerator array 1001, as suits a particular implementation.

As represented in FIG. 20, output data from the sum-of-products accelerator array can be applied through the data path controller 1003 to the input/output data paths for the system 1000. The input/output data paths for the system 1000 can be coupled to a processing unit configured to compute weights, provide inputs and utilize the outputs of the sum-of-products accelerator array.

Also, the output data from the sum-of-products accelerator array 1001 can be routed through the data path controller 1003 back to the memory array 1002 for use in iterative sum-of-products operations.

The system 1000 including the memory, the sum-of-products accelerator array and the data path logic can be implemented on a single integrated circuit in some embodiments. Also, the system 1000 can include on the same or different integrated circuits, arithmetic logic units, digital signal processors, general-purpose CPUs, state machines and the like that are configured to take advantage of the sum-of-products accelerator array 1001 during execution of computer processes.

A method for using an array of variable resistance cells according to any of the embodiments described herein can be executed using a system like that of FIGS. 18-20, using logic implemented on the same integrated circuit, coupled to the integrated circuit, or a combination of both which performs a configuration step in which the functional sets of cells in the array are programmed with respective weights, and an operating step, and in which the array is used to produce the sum of products data.

A method for operating an array of variable resistance cells to produce sum-of-products data comprises programming the programmable resistors in the variable resistance cells in the array with resistances corresponding to values of a weight factor for the corresponding cell; selectively applying inputs to rows of cells in the array applying currents to corresponding ones of the columns of cells in the array; and sensing voltages on one or more of the columns of cells in the array.

A technology is described that provides a sum-of-products accelerator array that is based on variable resistance cells, which can be used for neuromorphic computation systems. The variable resistance cells comprise a parallel connection of the transistor and a programmable resistor. Current is applied to a string of cells, and the voltage drop on the string provides a sum-of-products result. The resistance values in the programmable resistors can be fixed by the manufacturing process using for example one or more of doping concentration, layout definition, resistive layer thickness, area and size. Also, the resistance can be programmed using programmable resistance elements such as used in metal oxide ReRAM and phase change PCRAM devices. The programmable resistance can be represented in a variety of configurations as discussed above. Sensing can be accomplished using voltage sensors, where the voltage drop along the string can be compared to reference columns to estimate the sum-of-products results.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device for generating sum-of-products, comprising:
an array of variable resistance cells, variable resistance cells in the array each comprising a transistor and a programmable resistor connected in parallel, the array including n columns of cells including strings of series-connected cells and m rows of cells, and the variable resistance cells programmable to store values of a weight factor $R_{mn}$ for the corresponding cell;
m input drivers coupled to corresponding ones of the m rows of cells, the input drivers selectively applying inputs $X_m$ to more than one of the m rows in parallel;
n column drivers applying currents $I_n$ to corresponding ones of the n columns of cells to produce a voltage representing a sum-of-products of the inputs $X_m$ applied to the more than one of the m rows and the weight factors $R_{mn}$ for the cells; and voltage sensing circuits operatively coupled to the n columns of cells to sense the voltages representing the sums of products.

2. The device of claim 1, wherein the programmable resistor in the variable resistance cell comprises a buried implant resistor in the transistor, programmed by an implant doping profile.

3. The device of claim 1, including control and bias circuitry coupled to the array, and including logic for programming the programmable resistors in the array with resistances corresponding to values of the weight factor $R_{mn}$ for the corresponding cell.

4. The device of claim 1, wherein the programmable resistors in the variable resistance cells comprise phase change elements.

5. The device of claim 1, wherein the programmable resistors in the variable resistance cells comprise metal oxide elements.

6. The device of claim 1, wherein the programmable resistors in the variable resistance cells comprise conductive bridge elements.

7. The device of claim 1, wherein the programmable resistors in the variable resistance cells comprise a memory cell, and a resistor in parallel with a second transistor, the second transistor having a gate connected to the memory cell.

8. The device of claim 1, wherein a string in the strings includes a plurality of sub-strings, with contacts between the sub-strings, and logic for programming is configured to isolate sub-strings during programming of cells in the string.

9. The device of claim 1, wherein:
the variable resistance cells in the array each comprise a diffusion region in a substrate having proximal and distal areas, a first leg between the proximal and distal areas and a second leg between the proximal and distal areas;
the first leg including a channel region, and including a gate conductor over the channel region of the first leg forming a cell transistor; and
the second leg having a resistance that is a function of a doping profile and layout profile of the second leg which forms a programmable cell resistor in parallel with the cell transistor.

10. The device of claim 1, wherein the variable resistance cells in the array each comprise:
a diffusion region having proximal and distal areas, and a channel region between the proximal and distal areas, and including a gate conductor over the channel region of forming a cell transistor; and
a current path from the proximal area to the distal area comprising a first interlayer conductor, a conductor in an overlying patterned conductor layer, a second interlayer conductor, and a programmable resistance memory element forming a programmable cell resistor in parallel with the cell transistor.

11. The device of claim 10, including control and bias circuitry coupled to the array, and including logic for programming the programmable resistance memory elements in the array with resistances corresponding to values $R_{mn}$ for a corresponding cell.

12. A device for generating sum-of-products, comprising:
an array of variable resistance cells, variable resistance cells in the array each comprising a transistor and a programmable resistor connected in parallel, the array including n columns of cells including strings of series-connected cells and m rows of cells;
m input drivers coupled to corresponding ones of the m rows of cells, the input drivers selectively applying inputs $X_m$ to rows m;
n column drivers applying currents $I_n$ to corresponding ones of the n columns of cells; and
voltage sensing circuits operatively coupled to the n columns of cells, wherein the array includes a first reference column of cells configured to generate a low column reference voltage and a second reference column of cells configured to generate a high column reference voltage; the device including:
a circuit to generate sensing reference voltages as a function of the high and low column reference voltages; and
wherein the voltage sensing circuits include comparators configured to compare voltages on selected columns of cells with the sensing reference voltages to generate outputs indicating voltage levels on the selected columns.

13. A method for operating an array of variable resistance cells, variable resistance cells in the array each comprising a transistor and a programmable resistor connected in parallel, the array including n columns of cells including strings of series-connected cells and m rows of cells, to produce sum-of-products data, comprising:
programming the programmable resistors in the array with resistances corresponding to values of a weight factor $R_{mn}$ for corresponding cells;
selectively applying inputs $X_m$ to more than one of the m rows in parallel;
applying currents $I_n$ to corresponding ones of the n columns of cells to produce a voltage representing a sum-of-products of the inputs $X_m$ applied to the more than one of the m rows and the weight factors $R_{mn}$ for the cells; and
sensing voltages on one or more of then columns of cells to sense one or more of the voltages representing the sums of products.

14. A method for operating an array of variable resistance cells, variable resistance cells in the array each comprising a transistor and a programmed resistor connected in parallel, the array including n columns of cells including strings of series-connected cells and m rows of cells, to produce sum-of-products data, comprising:
selectively applying inputs $X_m$ to more than one of the m rows in parallel;
applying currents $I_n$ to corresponding ones of the n columns of cells to produce a voltage representing a sum-of-products of the inputs $X_m$ applied to the more than one of the m rows and weight factors $R_{mn}$ for the cells; and
sensing voltages on one or more of then columns of cells to sense one or more of the voltages representing the sums of products.

* * * * *

UNITED STATES PATENT AND TRADEMARK OFFICE
CERTIFICATE OF CORRECTION

PATENT NO. : 10,635,398 B2
APPLICATION NO. : 15/922359
DATED : April 28, 2020
INVENTOR(S) : Yu-Yu Lin et al.

It is certified that error appears in the above-identified patent and that said Letters Patent is hereby corrected as shown below:

In Column 4, Line 13, please replace "a weight $W_1$" with -- a weight $W_i$ --.

In Column 5, Line 24, please replace "The summing nodes ($SUM_1$ to $SUM_4$, ... $SUM_4$)" with -- The summing nodes ($SUM_1$ to $SUM_4$, ... $SUM_n$) --.

In Column 9, Line 67, please replace "$V_n = I_n*( T_{r.1} // R_{1n} ) + I_n*(T_{r.2} // R_{2n} ) + I_n*(T_{r3} // R_{3n})$" with -- $V_n = I_n*( T_{r.1} // R_{1n} ) + I_n*(T_{r.2} // R_{2n} ) + I_n*(T_{r.3} // R_{3n})$ --.

In Column 10, Line 12, please replace "$V_n = I_n*( T_{r.OFF}R_{1n} ) + I_n*(T_{r.ON} // R_{2n} ) + I_n*(T_{r.OFF} // R_{3n})$" with -- $V_n = I_n*( T_{r.OFF} // R_{1n} ) + I_n*(T_{r.ON} // R_{2n} ) + I_n*(T_{r.OFF} // R_{3n})$ --.

In Column 12, Line 15, please replace "voltage $V_{on}$ during" with -- voltage $V_{OFF}$ during --.

In Claim 13, Column 16, Line 42, please replace "more of then columns of cells" with -- more of the n columns of cells --.

In Claim 14, Column 16, Line 58, please replace "more of then columns of cells" with -- more of the n columns of cells --.

Signed and Sealed this
Eighteenth Day of August, 2020

Andrei Iancu
*Director of the United States Patent and Trademark Office*